(12) United States Patent
Kim et al.

(10) Patent No.: US 7,477,226 B2
(45) Date of Patent: Jan. 13, 2009

(54) SHIFT REGISTER

(75) Inventors: Binn Kim, Seoul (KR); Soo Young Yoon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 570 days.

(21) Appl. No.: 11/139,515

(22) Filed: May 31, 2005

(65) Prior Publication Data

US 2005/0264514 A1    Dec. 1, 2005

(30) Foreign Application Priority Data

May 31, 2004   (KR) ...................... 10-2004-0039136

(51) Int. Cl.
*G09G 3/36* (2006.01)
(52) U.S. Cl. ............................ 345/100; 345/98; 345/99
(58) Field of Classification Search .................. 345/98, 345/100, 96, 87; 377/64, 68, 79
See application file for complete search history.

(56) References Cited

U.S. PATENT DOCUMENTS

| | | | | |
|---|---|---|---|---|
| 5,093,655 A | * | 3/1992 | Tanioka et al. ................. | 345/96 |
| 5,859,630 A | * | 1/1999 | Huq ........................... | 345/100 |
| 7,321,355 B2 | * | 1/2008 | Lee et al. ...................... | 345/87 |

* cited by examiner

*Primary Examiner*—Kevin M Nguyen
(74) *Attorney, Agent, or Firm*—McKenna Long & Aldridge LLP

(57) ABSTRACT

Disclosed is a shift register capable of mitigating gate bias stress. The shift register, including a plurality of stages, includes an output buffer having a pull-up transistor and two pull-down transistors, each with gates connected to different nodes. One of the two pull-down transistors operates during an even frame portion of an LCD operation; and the other of the two pull-down transistors operates during an odd frame portion of the LCD display operation. Alternating operation of the pull-down transistors substantially mitigates gate stress, and substantially enables the shift register to be fabricated with amorphous silicon.

18 Claims, 5 Drawing Sheets

SHIFT REGISTER

This application claims the benefit of Korean Patent Application No. P2004-39136 filed in Korea on May 31, 2004, which is hereby incorporated by reference

BACKGROUND OF THE INVENTION

1. Field of the Invention

This invention relates to a driving circuit for a liquid crystal display, and more particularly to a shift register employing an amorphous silicon thin film transistor.

2. Discussion of the Related Art

Generally, a liquid crystal display (LCD) used as a display device for a television or a computer controls light transmittance of a liquid crystal using an electric field. To this end, the LCD includes a liquid crystal display panel having liquid crystal cells arranged in a matrix, and a driving circuit for driving the liquid crystal display panel.

In the liquid crystal display panel, gate lines and data lines are arranged in such a manner to cross each other. The crossing gate lines and data lines define a plurality of liquid crystal cells. The liquid crystal display panel is provided with pixel electrodes and a common electrode for applying an electric field to each liquid crystal cell. Each of the pixel electrodes is connected, via source and drain terminals of a thin film transistor as a switching device, to any one of the data lines. A gate terminal of the thin film transistor is connected to an adjacent gate line.

The driving circuit includes a gate driver for driving the gate lines, and a data driver for driving the data lines. The gate driver sequentially applies a scanning signal to the gate lines to sequentially drive the liquid crystal cells on the liquid crystal display panel. The data driver applies a video signal to each data line in conjunction with the scanning signal applied to the gate lines. Thus, the LCD controls light transmittance by an electric field applied between the pixel electrode and the common electrode in accordance with a video signal for each liquid crystal cell, thereby displaying a picture.

In such a driving circuit, the gate driver generates a scanning signal for sequentially driving the gate lines using a shift register. The data driver generates a sampling signal for sequentially sampling video signals provided externally by a certain unit using the shift register.

Figure 1:
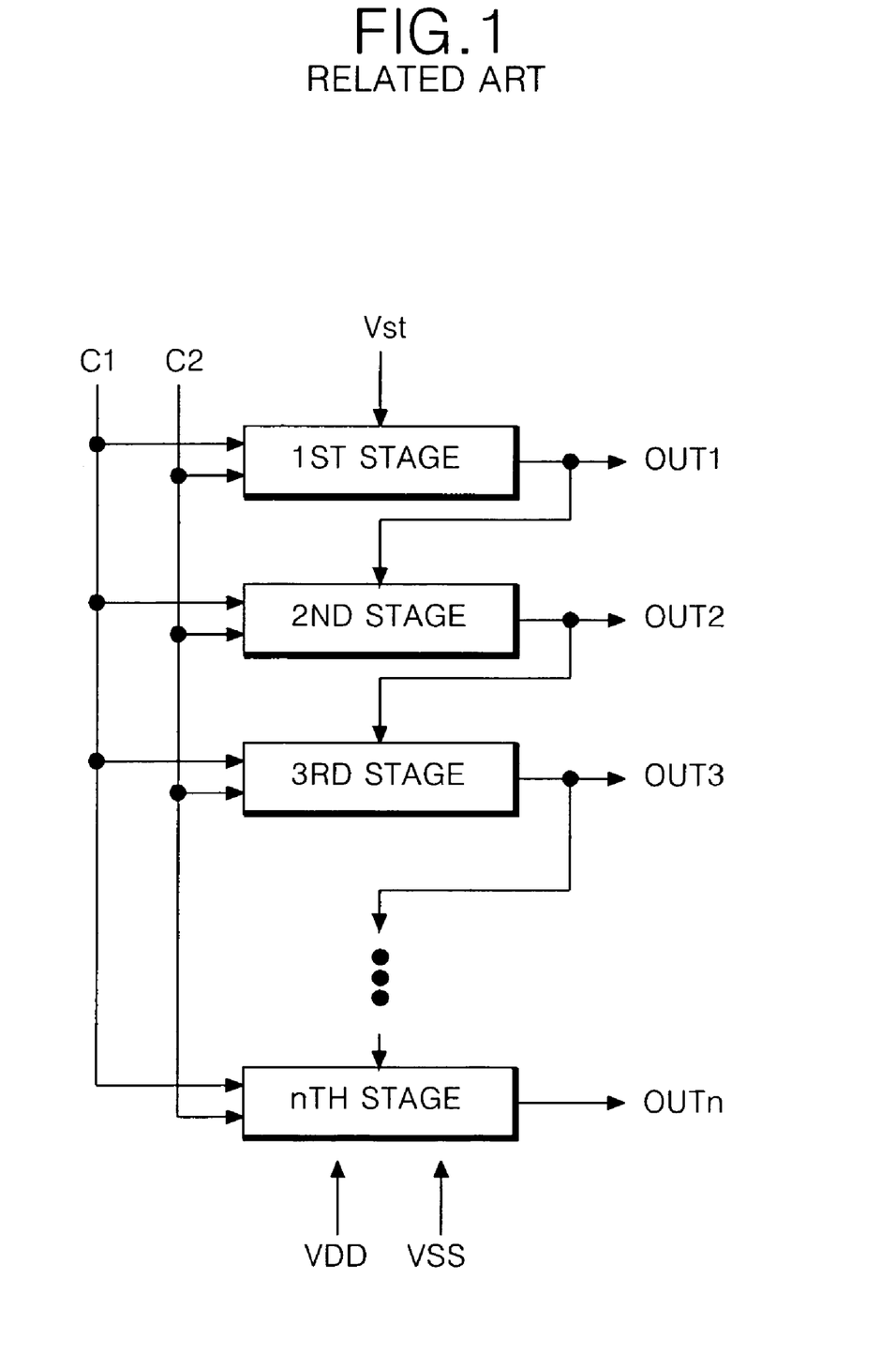
FIG. 1 is a schematic block diagram illustrating a configuration of a related art two-phase shift register.

FIG. 1 is a block diagram illustrating a configuration of a related art two-phase shift register.

Referring to FIG. 1, the shift register includes 1st to nth stages connected in cascade. The 1st to nth stages are commonly supplied with first and second clock signals C1 and C2 along with high-level and low-level driving voltages (not shown), and are supplied with a start pulse Vst, which may be an output signal of the previous stage. The 1st stage outputs a first output signal Out1 in response to the start pulse Vst and the first and second clock signals C1 and C2. The 2nd to nth stages output 2nd to nth output signals, respectively, in response to the output signal of the previous stage and the first and second clock signals C1 and C2. The 1st to nth stages have an identical circuit configuration and sequentially shift a signal corresponding to the start pulse Vst. The 1st to nth output signals Out1 to Outn are supplied with a scanning signal for sequentially driving the gate lines of the liquid crystal display panel, or with a sampling signal for sequentially sampling a video signal within the data driver.

Figure 2:
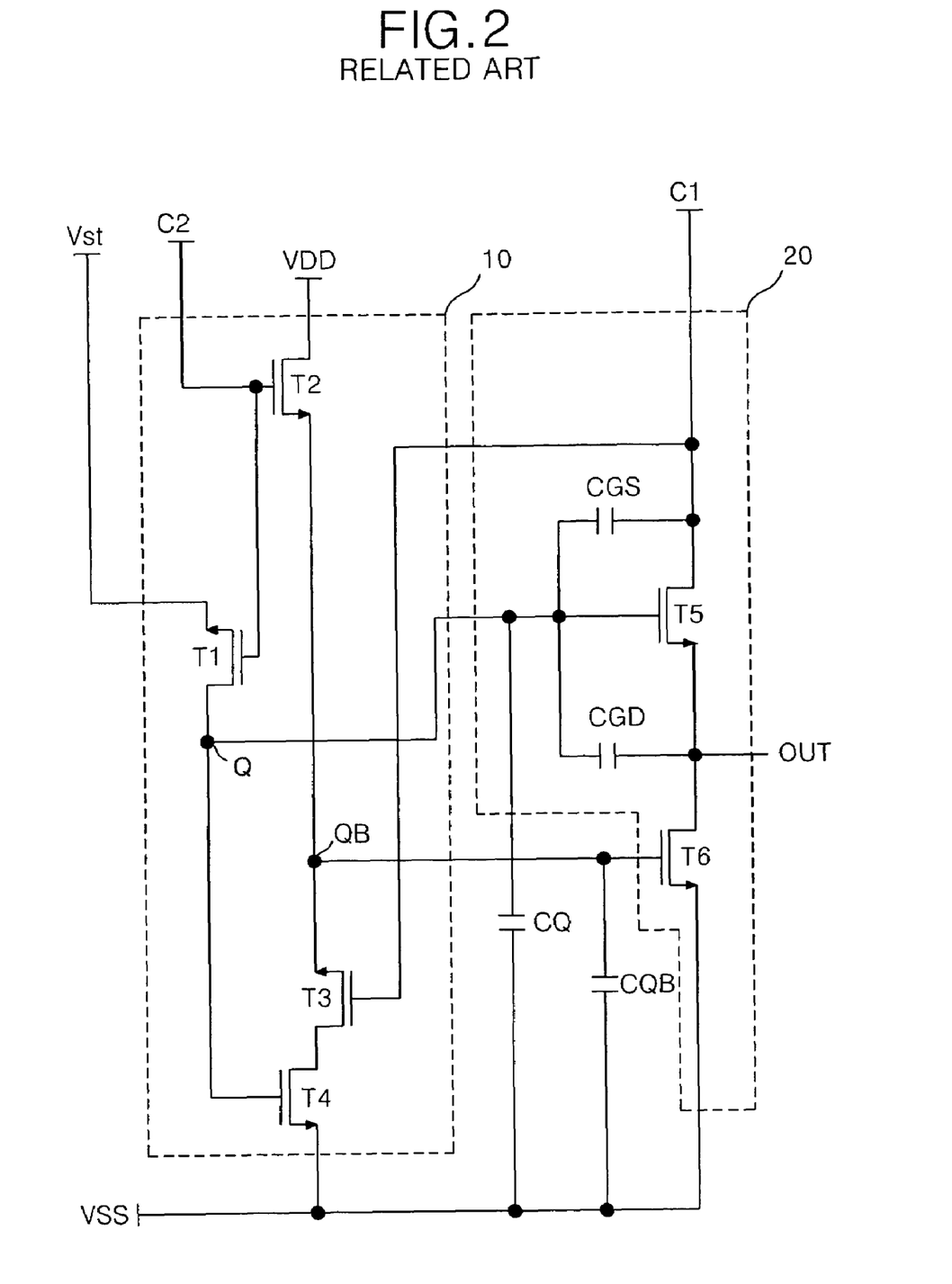
FIG. 2 is a detailed circuit diagram of one stage illustrated in FIG. 1.

FIG. 2 illustrates a detailed circuit configuration of one stage shown in FIG. 1.

In FIG. 2, the stage includes an output buffer part 20 having a pull-up NMOS transistor T5 for outputting a first clock signal C1 to an output line under control of a Q nodes and a pull-down NMOS transistor T6 for outputting a low-level driving voltage VSS under control of a QB node, and a controller part 10 having first to fourth NMOS transistors T1 to T4 for controlling the Q node and the QB node.

Figure 3:
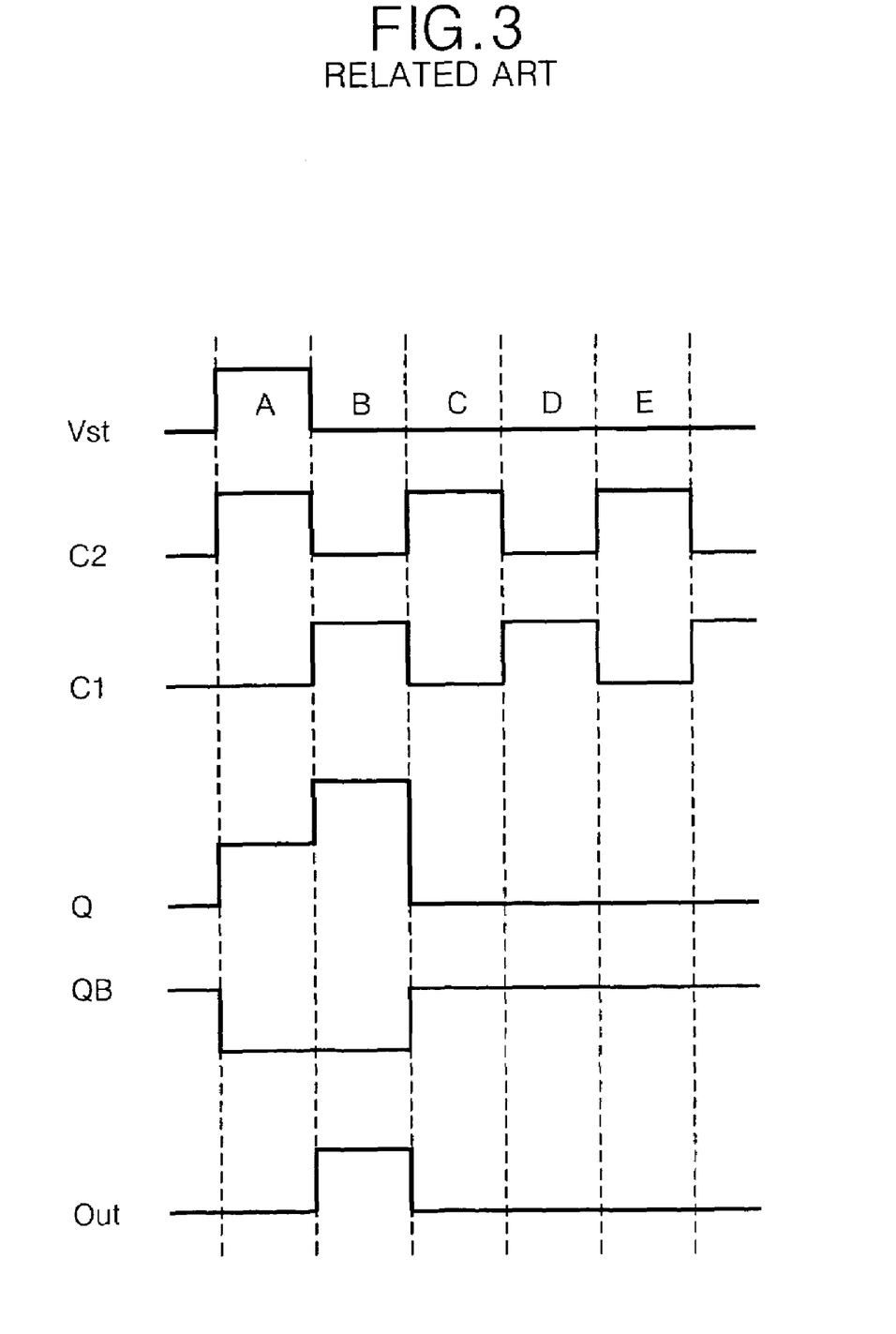
FIG. 3 is a driving waveform diagram of the stage illustrated in FIG. 2.

The stage is supplied with high-level and low-level voltages VDD and VSS, a start pulse Vst, and a first and second clock signals C1 and C2. Herein, the first clock signal C1 is a signal in which a high-state voltage and a low-state voltage, each having a certain pulse width, are alternately supplied as illustrated in FIG. 3, whereas the second clock signal C2 (not shown) is inverted relative to the first clock signal C1. The start pulse Vst is either supplied externally or from the output signal of the previous stage.

An operation procedure of the stage will be described with reference to driving waveforms illustrated in FIG. 3.

In a period A, a high-state voltage of start pulse Vst is supplied in synchronization with a high-state voltage of the second clock signal C2. The first NMOS transistor T1 is turned on by the high-state voltage of the second clock signal C2 to thereby apply the high-state voltage of the start pulse Vst to the Q node, thereby pre-charging the Q node. The high-stage voltage pre-charged into the Q node turns on the fifth NMOS transistor T5 to thereby apply the low-state voltage of the first clock signal C1 to the output line. The second NMOS transistor T2 is also turned on by the high-state voltage of the second clock signal C2 to thereby apply the high-level driving voltage VDD to the QB node. Then, the high-level driving voltage VDD supplied to the QB node turns on the sixth NMOS transistor T6 to thereby supply a low-level driving voltage VSS. Thus, in period A, the output line of the stage outputs a low-state output signal OUT.

In period B, the first NMOS transistor T1 is turned off by the low-state voltage of the second clock signal C2 to thereby float the Q node into a high state. Thus, the pull-up NMOS transistor T5 maintains a turn-on state. Further, as the high-state voltage is supplied by the first clock signal C1, the floated Q node is boot-strapped by an affect of a parasitic capacitor CGD formed by an overlap between the gate electrode and the drain electrode of the pull-up NMOS transistor T5. Accordingly, the voltage at the Q node is raised further to turn on the pull-up NMOS transistor T5, thereby rapidly supplying the high-state voltage of the first clock signal C1 to the output line. Further, the Q node floated into a high state turns on the fourth NMOS transistor T4, and the high-state first clock signal C1 turns on the third NMOS transistor T3 to supply the low-level driving voltage VSS to the QB node, thereby turning off the pull-down NMOS transistor T6. Thus, in the B period, the output line of the stage outputs a high-state output signal OUT.

In period C, the first NMOS transistor T1 is turned on by the high-state voltage of the second clock signal C2 to supply the low-state voltage of the start pulse Vst to the Q node, thereby turning off the pull-up NMOS transistor T5. Also, the second NMOS transistor T2 is turned on by the high-state voltage of the second clock signal C2 to supply the high-level driving voltage VDD to the QB node, thereby turning on the pull-down NMOS transistor T6 to output the low-level driving voltage VSS to the output line. Also in period C, the third NMOS transistor T3 is turned off by the low-state voltage of the first clock signal C1, and the fourth NMOS transistor T4 is turned off by the low-state voltage of the Q node, thereby keeping the high-level driving voltage VDD at the QB node. Thus, in the C period, the output line of the stage outputs a low-state output signal OUT.

In period D, the first NMOS transistor T1 is turned off by the low-state voltage of the second clock signal C2 to thereby float the Q node. Further, the second NMOS transistor T2 is turned off by the low-state voltage of the second clock signal C2, and the fourth NMOS transistor T4 is turned off by the Q node floated into a low state, so that the QB node is floated in a high state that is slightly lower than the high-level driving voltage VDD supplied in the previous period C even though the third NMOS transistor T3 is turned on by a high-state voltage of the first clock signal C1. Thus, the pull-down NMOS transistor T6 maintains a turn-on state to thereby output the low-level driving voltage VSS to the output line. As a result, in period D, the output line of the stage outputs a low-state output signal OUT.

In the remaining periods, the C and D periods are alternately repeated, so that the output signal OUT of the stage continuously maintains a low state.

There have been efforts to integrate the shift register into the liquid crystal display panel using an amorphous silicon thin flm transistor. However, the amorphous silicon thin film transistor may not function properly due to bias stress when a direct current voltage DV is continuously supplied to the thin film transistor's gate terminal.

For example, in the related art shift register, a high-level driving voltage VDD is applied to the QB node, which is, the gate node of the pull-down NMOS transistor T6, providing a direct current voltage during a majority of periods (i.e., during the remaining period excluding the A and B periods when the Q node becomes a high state) as can be seen in FIG. 3. Persistent direct current voltage on the gate of pull-down NMOS transistor T6 causes a gate bias stress on the transistor, which changes the transistor's threshold voltage Vzh. In this case, a minimum voltage applied to the QB node for the purpose of keeping the Q node at the turn-off voltage is referred to as a clamping voltage, which needs to be more than a certain voltage level. However, a change of threshold voltage Vth in pull-down NMOS transistor T6 due to the gate bias stress reduces the clamping voltage applied to the QB node (i.e., an applied voltage—Vth). Therefore, a problem arises in that an erroneous operation of the shift register, such as a multiple output generation, occurs below a certain voltage on the QB node.

SUMMARY OF THE INVENTION

Accordingly, the present invention is directed to a shift register that substantially obviates one or more of the aforementioned problems due to limitations and disadvantages of the related art. In general, the present invention achieves this by providing a shift register capable of preventing a gate bias stress on a pull-down transistor.

An advantage of the present invention is that it enables a shift register to be fabricated with amorphous silicon.

Another advantage of the present invention is that it enables a shoft register to be integrated into an LCD panel.

Additional advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

The aforementioned and other advantages of the present invention are achieved with a shift register having a plurality of stages that comprises first, second, and third driving voltage supply lines; at least two clock signal supply lines; an output buffer having an output pull-up transistor and a first and second output pull-down transistors; a first controller having an input connected to a start signal supply line and an output connected to a first node; and a second controller having an input connected to the first and second voltage supply lines and an output connected to the gates of the first and second output pull-down transistors.

In another aspect of the present invention, the aforementioned and other advantages are achieved by a shift register having a plurality of stages that comprises an output buffer having first transistor and an even and odd transistor, the even and odd transistors having the same polarity a first controller for controlling a state of the output buffer; and a second controller for switching between the even and odd transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the illustrated embodiments of the present invention. Hereinafter, the illustrated embodiments of the present invention will be described with reference to FIGS. 4 and 5.

Figure 4:
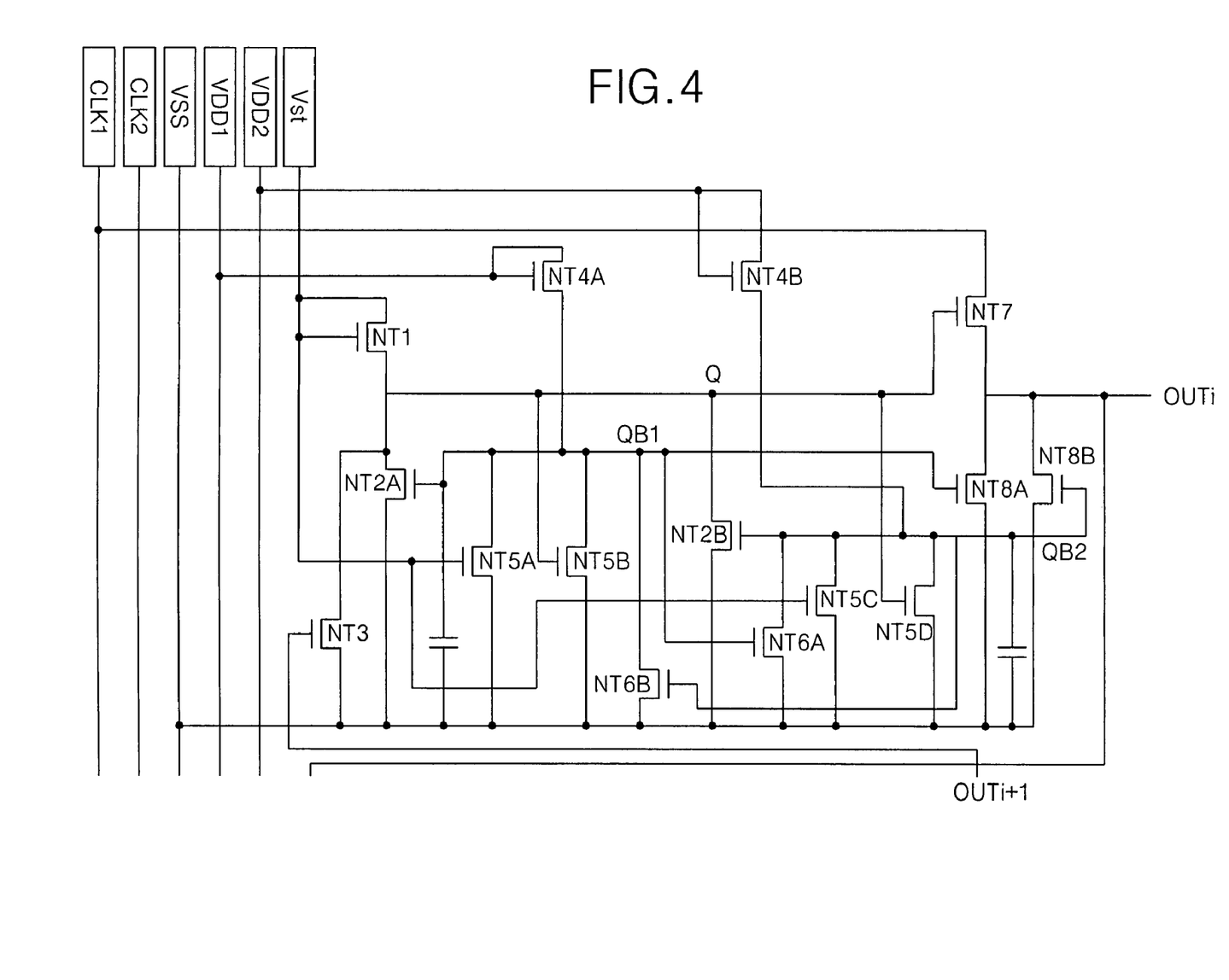
FIG. 4 is a detailed circuit diagram of a stage of a shift register according to an embodiment of the present invention.
Figure 5:
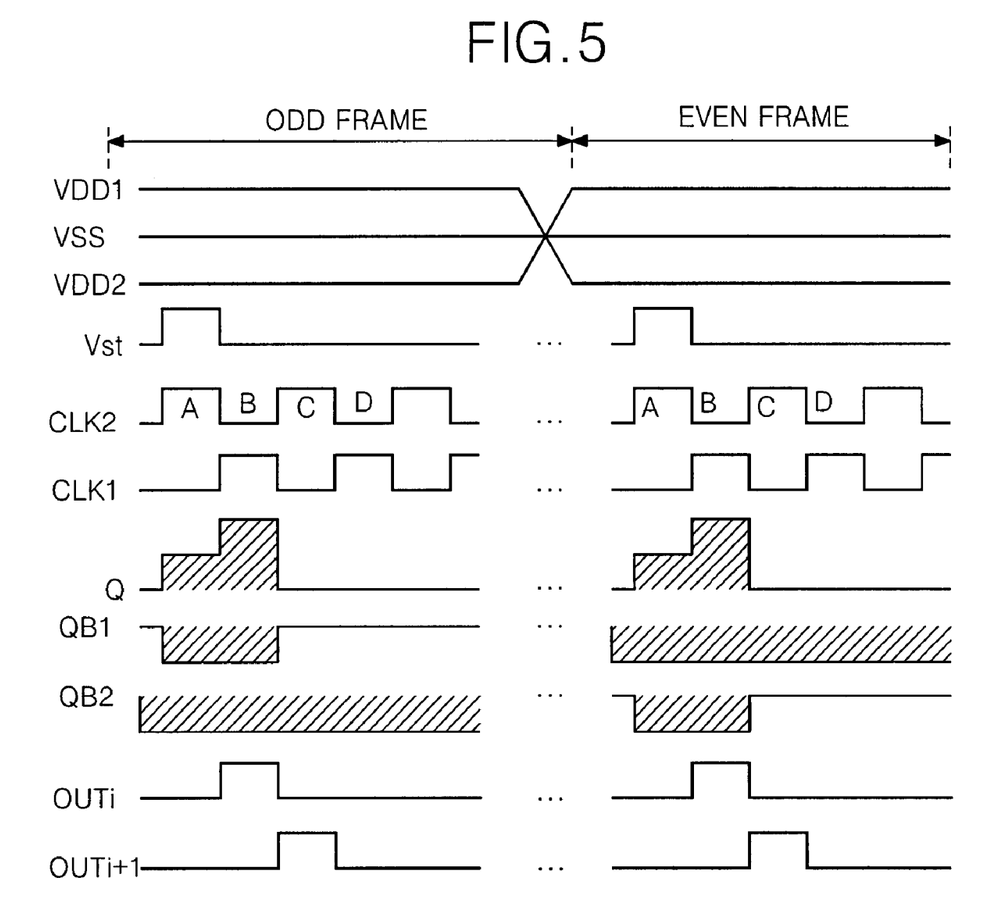
FIG. 5 is an exemplary driving waveform diagram of the stage illustrated in FIG. 4.

FIG. 4 is a circuit diagram illustrating a configuration of any one of a plurality of stages connected in cascade in a shift register according to an embodiment of the present invention. FIG. 5 is a driving waveform diagram of a stage illustrated in FIG. 4.

Referring to FIG. 4, a stage of the shift register includes an output buffer having a pull-up transistor NT7 for outputting a first clock signal CLK1 to an output line under control of a Q node, and first and second pull-down transistors NT8A and NT8B for outputting a third driving voltage VSS to the output line under control of QB1 and QB2 nodes; a first controller having first to third transistors NT1 to NT3 for pre-charging and discharging the Q node; and a second controller having transistors NT4A to NT6B for making an alternate driving current while dividing the QB1 and QB2 nodes into odd and even frames. Transistors NT1 to NT8B may employ NMOS transistors or PMOS transistors. For purposes of illustration, a case of employing NMOS transistors only will be described.

The first transistor NT1 of the first controller may be connected, in a diode configuration, to an input line of start pulse Vst to pre-charge a high-state voltage of the start pulse Vst into the Q node. The transistors NT2A and NT2B discharge the Q node under control of the respective QB1 and QB2 nodes, and the third transistor NT3 is controlled by an output voltage OUTi+1 of the next stage to discharge the Q node.

The second controller includes transistors NT4A and NT4B for charging first and second high-level voltages VDD1 and VDD2 into the QB1 and QB2 nodes; respectively, transistors NT5A to NT5D for discharging the QB1 and QB2 nodes under control of the start pulse Vst and the Q node; a transistor NT6A for discharging the QB2 node under control of the QB1 node, and a transistor NT6B for discharging the QB1 node under control of the QB2 node.

By the second controller, as illustrated in FIGS. 4 and 5, a first pull-down transistor NT8A is driven under control of the QB1 node at an odd frame at which the first driving voltage VDD1 is a high-level state, whereas a second pull-down transistor NT8B is driven under control of the QB2 node at an even frame at which the second driving voltage VDD2 is a high-level state. The first and second pull-down transistors NT8A and NT8B are alternately driven at the odd and even frames in this manner, so that it becomes possible to minimize a stress caused by a direct current bias.

The particular stage illustrated in FIG. 4 is supplied with the first clock signal CLK1 of the phase-inverted first and second clock signals CLK1 and CLK2, and the next stage is supplied with the second clock signal CLK2. Each stage is alternately supplied with the first and second clock signals CLK1 and CLK2. Further, each stage is supplied with the first and second driving voltages VDD1 and VDD2 having the polarities inverted in opposition to each other at the odd and even frames, and each stage is supplied with the third driving voltage VSS.

An operation of the shift register having such a configuration will be described with reference to a driving waveform illustrated in FIG. 5.

In the odd frame interval, the first driving voltage VDD1 becomes a high state while the second driving voltage VDD2 becomes a low state. Thus, the transistor NT4A connected, in a diode configuration, to the supply line for the first driving voltage VDD1 maintains an on state, whereas the transistor NT4B connected, in a diode type, to the supply line for the second driving voltage VDD2 maintains an off state. Accordingly, the QB1 node makes an operation opposite to the QB2 node at the odd frame, thereby allowing the first pull-down transistor NT8A to operate opposite to the pull-up transistor NT7. Further, the QB2 node maintains a low state, thereby allowing the second pull-down transistor NT8B to maintain an off state.

In period A of the odd frame, the low-state voltage of the first clock signal CLK1, the high-state voltage of the second clock signal CLK2 and the high-state voltage of the start pulse Vst are supplied. The first transistor NT1 is turned on by the high-state voltage of the start pulse Vst to pre-charge the Q node into a high-state voltage. The pull-up transistor NT7 is turned on by the high-state voltage of the Q node, thereby applying the low-state voltage of the first clock signal CLK1 as an output signal OUT1. The transistor NT4A is turned on by the high-state first driving voltage VDD1 and the transistors NT5A and NT5B are respectively turned on by high-state voltages of the start pulse Vst and the Q node, so that the QB1 node becomes a low state by the driving voltage VSS. Further, the transistor NT4B is turned off by a low-state second driving voltage VDD, and the transistors NT5C and NT5D are respectively turned on by the high-state voltages of the start pulse Vst and the Q node, so that the QB2 node becomes a low state by the third driving voltage VSS. Accordingly, the first and second pull-down transistors NT8A and NT8B are turned off.

In period B, the high-state voltage of the first clock signal CLK1, the low-state voltage of the second clock signal CLK2 and the low-state voltage of the start pulse Vst are supplied. The first transistor NT1 is turned off by the low-state voltage of the start pulse Vst, and the third transistor NT3 is turned off by the low-state voltage of the next stage output signal OUTi+1, thereby floating the Q node into a high state. The Q node, which is floated into a high state, is bootstrapped in response to the high-state voltage of the first clock signal CLK1 by a coupling action of the parasitic capacitor CGD defined by an overlap between the gate electrode and the source electrode of the pull-up transistor NT7. Thus, a voltage at the Q node is further raised to more certainly turn on the pull-up transistor NT7, thereby applying the high-state voltage of the first clock signal CLK1 as an output signal OUTi. Herein, in order to enhance the bootstrapping effect at the Q node, an additional capacitor (not shown) may be provided in parallel to the parasitic capacitor CGD. The transistor NT4A is turned on by the high-state first driving voltage VDD1 while the transistor NT5B is turned on by the high-stage voltage at the bootstrapped Q node, so that the QB1 node becomes a low state by the third driving voltage VSS. Further, the transistor NT5D is turned on by the high-state voltage at the Q node, so that the QB2 node maintains a low state. Accordingly, the first and second pull-down transistors NT8A and NT8B are turned off.

In period C, the low-state voltage of the first clock signal CLK1, the high-state voltage of the second clock signal CLK2 and the low-state voltage of the start pulse Vst are supplied. The first transistor NT1 is turned off by the low-state voltage of the start pulse Vst, and the third transistor NT3 is turned on by the high-state voltage of the next stage output signal OUTi+1 to apply the third driving voltage VSS to the Q node, thereby turning off the pull-up transistor NT7. All the transistors NT5A to NT5D are turned off by the low-state voltages of the start pulse Vst and the Q node; and the high-state first driving voltage VDD1 is charged, via the transistor NT4A remaining at a turn-on state, into the QB1 node. Thus, the first pull-down transistor NT8A is turned on to thereby apply the third driving voltage VSS as an output signal OUTi. Further, by the high-state voltage at the QB1 node, the transistor NT6A is turned on to maintain the QB2 node at a low state, and the transistor NT2A is turned on to maintain the Q node at a low state.

In period D, the high-state voltage of the first clock signal CLK1, the low-state voltage of the second clock signal CLK2, and the low-state voltage of the start pulse Vst are supplied. The first and third transistors NT1 and NT3 are respectively turned off by the low-state voltages of the start pulse Vst and the next stage output signal OUTi+1, so that the Q node maintains the previous low state. All the transistors NT5A-NT5D are turned off by the low-state voltages of the start pulse Vst and the Q node, and the QB1 node maintains a high state by the transistor NT4A, which maintains an on state. Accordingly, the first pull-down transistor NT8A is turned on to apply the third driving voltage VSS as an output signal OUTi. Further, by the high-state voltage at the QB1 node, the transistor NT6A is turned on to keep the QB2 node at a low state while the transistor NT2A is turned on to fix the Q node at a low state.

In the remaining period of the odd frame, the operations in the above-mentioned C and D periods are repeated to keep the current stage output signal OUTi at a low state.

Next, in the even frame interval, the first driving voltage VDD1 becomes a low state while the second driving voltage VDD2 becomes a high state. Thus, the transistor NT4A connected, in a diode configuration, to the supply line for the first driving voltage VDD1 maintains an off state, whereas the transistor NT4B connected, in a diode configuration, to the supply line for the second driving voltage VDD2 maintains an on state. Accordingly, the QB2 node operates opposite to the Q node at the even frame, thereby allowing the second pull-down transistor NT8B to operate opposite to the pull-up transistor NT7. Further, the QB1 node maintains a low state, thereby allowing the first pull-down transistor NT8A to maintain a turn-off state.

In period A of the even frame, the low-state voltage of the first clock signal CLK1, the high-state voltage of the second clock signal CLK2, and the high-state voltage of the start pulse Vst are supplied. The first transistor NT1 is turned on by the high-state voltage of the start pulse Vst to thereby pre-charge the high-state voltage of the start pulse Vst into the Q node. The pull-up transistor NT7 is turned on by the high-state voltage of the Q node, thereby applying the low-state voltage of the first clock signal CLK1 as an output signal OUTi. The transistor NT4B is turned on by the high-state second driving voltage VDD2 while the transistors NT5C and NT5D are respectively turned on by high-state voltages of the start pulse Vst and the Q node, so that the QB2 node is driven to a low state by the third driving voltage VSS. Further, the transistor NT4A is turned off by the low-state first driving voltage VDD1, and the transistors NT5A and NT5B are respectively turned on by the high-state voltages of the start pulse Vst and the Q node, so that the QB1 node is driven to a low state by the third driving voltage VSS. Accordingly, the first and second pull-down transistors NT8A and NT8B are turned off.

In period B, the high-state voltage of the first clock signal CLK1, the low-state voltage of the second clock signal CLK2, and the low-state voltage of the start pulse Vst are supplied. The first transistor NT1 is turned off by the low-state voltage of the start pulse Vst, and the third transistor NT3 is turned off by the low-state voltage of the next stage output signal OUTi+1, thereby floating the Q node into a high state. The Q node, which is floated into a high state, is bootstrapped in response to the high-state voltage of the first clock signal CLK1 to more certainly turn on the pull-up transistor NT7, thereby applying the high-state voltage of the first clock signal CLK1 as an output signal OUTi. The transistor NT4B is turned on by the high-state second driving voltage VDD2 while the transistor NT5D is turned on by the high-state voltage at the bootstrapped Q node, so that the QB2 node becomes a low state by the third driving voltage VSS. Further, the transistor NT5B is turned on by the high-state voltage at the Q node, so that the QB1 node maintains a low state. Accordingly, the first and second pull-down transistors NT8A and NT8B are turned off.

In period C, the low-state voltage of the first clock signal CLK1, the high-state voltage of the second clock signal CLK2, and the low-state voltage of the start pulse Vst are supplied. The first transistor NT1 is turned off by the low-state voltage of the start pulse Vst, and the third transistor NT3 is turned on by the high-state voltage of the next stage output signal OUTi+1 to apply the third driving voltage VSS to the Q node, thereby turning off the pull-up transistor NT7. All the transistors NT5A to NT5D are turned off by the low-state voltages of the start pulse Vst and the Q node, and the high-state second driving voltage VDD2 is charged, via the transistor NT4B remaining at a turn-on state, into the QB2 node. Thus, the second pull-down transistor NT8B is turned on to thereby apply the third driving voltage VSS as an output signal OUTi. Further, by the high-state voltage at the QB2 node, the transistor NT6B is turned on to keep the QB1 node at a low state, and the transistor NT2B is turned on to more certainly maintain the Q node at a low state.

In period D, the high-state voltage of the first clock signal CLK1, the low-state voltage of the second clock signal CLK2, and the low-state voltage of the start pulse Vst are supplied. The first and third transistors NT1 and NT3 are respectively turned off by the low-state voltages of the start pulse Vst and the next stage output signal OUTi+1, so that the Q node maintains the a previous low state. All the transistors NT5A-NT5D are turned off by the low-state voltages of the start pulse Vst and the Q node, and the QB2 node maintains a high state by the transistor NT4B maintaining a turn-on state. Accordingly, the second pull-down transistor NT8B is turned on to apply the third driving voltage VSS as an output signal OUTi. Further, by the high-state voltage at the QB2 node, the transistor NT6B is turned on to keep the QB1 node at a low state while the transistor NT2B is turned on to fix the Q node at a low state.

In the remaining periods of the even frame, the operations in the above-mentioned C and D periods are repeated to keep the current stage output signal OUTi at a low state.

As described above, the shift register according to the embodiment of the present invention can alternately drive the dual pull-down transistors NT8A and NT8B at the odd and even frames, thereby minimizing a gate bias stress. Also, the transistors NT5A and NT5B for discharging the QB1 node and the transistors NT4A and NT4B for charging the QB1 and QB2 nodes can alternately be driven at the odd and even frames, thereby minimizing a gate bias stress. In addition, the transistors NT4A and NT4B are connected, in a diode type, to the respective supply line for the first and second driving voltages VDD1 and VDD2. As mentioned above, the transistors NT4A and NT4B are connected in a diode configuration such that a high-state voltage is loaded on all the gate/source/drain electrodes at an operating frame while a low-state voltage is loaded on all the gate/source/drain electrodes at an idle frame, so that deterioration may be mitigated. As mentioned above, a structure capable of minimizing a bias stress is applied to improve a life of the panel.

As described above, the shift register according to the present invention can implement all of the transistors NT2A and NT2B for discharging the Q node and the transistors NT4A to NT6B for charging and discharging the QB1 node and the QB2 node, along with the pull-down transistors NT8A and NT8B, to use alternating transistors to drive the odd and even frames, thereby minimizing a gate bias stress.

Furthermore, the shift register according to the present invention connects the transistors NT4A and NT4B, in a diode configuration, to the respective supply line for the first and second driving voltages VDD1 and VDD2 such that a high-state voltage is loaded on all the gate/source/drain electrodes at an operating frame while a low-state voltage is loaded on all the gate/source/drain electrodes at an idle frame, so may be mitigated. Accordingly, a bias stress can be minimized to improve a life of the panel.

As a result, the shift register according to the present invention may prevent a circuit malfunction caused by a gate bias stress when it employs an amorphous silicon thin film transistor.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:
1. A shift register having a plurality of stages, each stage comprising:
   first, second, and third driving voltage supply lines;
   at least two clock signal supply lines;

an output buffer having an output pull-up transistor and first arid second output pull-down transistors;

a first controller having an input connected to a start signal supply line and an output connected to a first node; and a second controller having an input connected to the first and second voltage supply lines and an output connected to gates of the first and second output pull-down transistors, wherein high voltages are alternately applied to gates of the first and second output pull-down transistors every predetermined frame;

wherein the first and second output pull-down transistors are connected to second and third nodes, respectively; and wherein first and second driving voltages supplied to the first and second voltage supply lines have voltages alternately inverted with respect to each other every predetermined frame.

2. The shift register according to claim 1, wherein the first controller includes:

a charge transistor having a gate connected to the start signal supply line and an output connected to the first node; and a plurality of discharge transistors connected to the first node and the third driving voltage supply line.

3. The shift register according to claim 2, wherein the first node is connected to a gate of the pull-up output transistor.

4. The shift register according to claim 2, wherein the plurality of discharge transistors includes:

a first discharge transistor having a gate connected to the second node; and a second discharge transistor having a gate connected to the third node.

5. The shift register according to claim 4, wherein the second controller includes an odd frame voltage control transistor having a gate connected to the first driving voltage supply line and an output connected to the second node.

6. The shift register according to claim 4, wherein the second controller includes an even frame voltage control transistor having a gate connected to the third node.

7. The shift register according to claim 4, further including a third discharge control transistor having a gate connected to an output of a later stage.

8. The shift register according to claim 4, wherein the second node is connected to a gate of the first output pull-down transistor.

9. The shift register according to claim 4, wherein the third node is connected to a gate of the second output pull-down transistor.

10. The shift register according to claim 1, wherein the output pull-up transistor and the first and second output pull-down transistors include amorphous silicon.

11. The shift register according to claim 1, wherein a third driving voltages supplied to the third voltage supply lines has a low voltage.

12. The shift register according to claim 11, wherein the first and second driving voltages are changed with respect to the third driving voltage.

13. A shift register having a plurality of stages, each stage comprising:

an output buffer having a first transistor and second and third transistors, the second and third transistors having the same polarity;

a first controller for controlling an output state of the output buffer; and a second controller for switching an output control between the second and third transistors, wherein high voltages are alternately applied to gates of the second and third transistors every predetermined frame;

wherein the second and third transistors are connected to second and third nodes, respectively; and wherein first and second driving voltages supplied to first and second voltage supply lines have voltages alternately inverted with respect to each other every predetermined frame.

14. The shift register according to claim 13, further comprising:

first and second voltage supply lines connected to the second controller.

15. The shift register according to claim 13, further comprising a start signal supply line connected to the first controller.

16. The shift register according to claim 13, wherein the first controller is connected to an output of a subsequent stage.

17. The shift register according to claim 13, further comprising a clock signal supply line connected to the output buffer.

18. The shift register according to claim 13, wherein the first to third transistors include amorphous silicon.

* * * * *